United States Patent
Chu et al.

(10) Patent No.: US 6,852,004 B2
(45) Date of Patent: Feb. 8, 2005

(54) CMP MACHINE DRESSER AND METHOD FOR DETECTING THE DISLODGEMENT OF DIAMONDS FROM THE SAME

(75) Inventors: Ronfu Chu, Taipei (TW); Li-Wu Tsao, Keelung (TW)

(73) Assignee: Nanya Technology Corporation, Taoyuan (TW)

(*) Notice: Subject to any disclaimer, the term of this patent is extended or adjusted under 35 U.S.C. 154(b) by 250 days.

(21) Appl. No.: 10/153,348

(22) Filed: May 21, 2002

(65) Prior Publication Data

US 2003/0092270 A1 May 15, 2003

(30) Foreign Application Priority Data

Nov. 15, 2001 (TW) ........................................ 90128314 A

(51) Int. Cl.⁷ .............................................. B24B 53/12
(52) U.S. Cl. .............................. 451/8; 451/56; 451/443
(58) Field of Search .............................. 451/8, 56, 443, 451/444

(56) References Cited

U.S. PATENT DOCUMENTS

| | | | | |
|---|---|---|---|---|
| 5,985,093 A | * | 11/1999 | Chen ....................... | 156/345.13 |
| 5,989,405 A | * | 11/1999 | Murata et al. ............. | 205/110 |
| 6,106,382 A | * | 8/2000 | Sakaguchi ................. | 451/443 |
| 6,190,240 B1 | * | 2/2001 | Kinoshita et al. .......... | 451/56 |
| 6,213,856 B1 | * | 4/2001 | Cho et al. ................. | 451/443 |
| 6,220,936 B1 | * | 4/2001 | Quek ......................... | 451/41 |
| 6,234,868 B1 | * | 5/2001 | Easter et al. .............. | 451/5 |
| 6,368,198 B1 | * | 4/2002 | Sung et al. ................. | 451/443 |
| 6,416,878 B2 | * | 7/2002 | An ............................ | 428/565 |
| 6,419,574 B1 | * | 7/2002 | Takahashi et al. ......... | 451/548 |
| 6,508,697 B1 | * | 1/2003 | Benner et al. ............. | 451/443 |
| 6,540,597 B1 | * | 4/2003 | Ohmori ..................... | 451/443 |
| 6,679,243 B2 | * | 1/2004 | Sung ......................... | 125/12 |
| 6,722,948 B1 | * | 4/2004 | Berman ..................... | 451/21 |

FOREIGN PATENT DOCUMENTS

| | | | | |
|---|---|---|---|---|
| JP | 10337668 A | * | 12/1998 | ........... B24D/3/00 |
| JP | 2001062719 A | * | 3/2001 | ........... B24B/53/00 |

* cited by examiner

Primary Examiner—David B. Thomas
(74) Attorney, Agent, or Firm—Ladas & Parry LLP

(57) ABSTRACT

A CMP machine dresser. The dresser includes a substrate, a first conductive layer and a second conductive layer respectively disposed and isolated in the substrate, a plurality of diamonds mounted in the first conductive layer and the second conductive layer, and a bonding layer disposed on the substrate for attaching the diamonds. The first conductive layer and the second conductive layer detect the conductive materials penetrating the original position of the diamonds when any of the diamonds dislodges, so as to determine the diamonds dislodgement.

15 Claims, 2 Drawing Sheets

CMP MACHINE DRESSER AND METHOD FOR DETECTING THE DISLODGEMENT OF DIAMONDS FROM THE SAME

BACKGROUND OF THE INVENTION

1. Field of the Invention

The present invention relates to a dressing apparatus for conditioning and regenerating a chemical mechanical polishing (referred to as CMP hereafter) pad, and more particularly to a CMP machine dresser and method for detecting dislodgement of diamonds from the same.

2. Background

As densities of Integrated Circuits increase, the global planarization of the intermediate insulating layer has become important. CMP in particular has received special attention as a planarization method. Highly integrated semiconductor devices are manufactured by depositing conducting materials between insulating materials alternately to form patterns. The surface must be flat in order to apply the pattern layer.

As the semiconductor devices get more integrated, the miniaturization of features and multilevel interconnections are needed. Global planarization is one of the most important prerequisites to achieve this. As the structure of microprocessors and DRAMs becomes multileveled, problems may occur if the layers upon which the film is deposited are not flat. In the photolithography process in particular, if the process begins on an unflattened layer, incident light will reflect diffusely, which will cause an imprecise photo resist pattern. Planarization of the surface must take place by polishing the unnecessarily deposited areas.

Polishing pads must be cleaned after use due to residue. FIG. 1 shows a perspective view of a dressing apparatus, illustrating how it is integrated into a CMP device for wafer processes. As shown in FIG. 1, the dressing apparatus 10 includes a sleeve bearing mechanism 12, a carrier plate 14, and a plurality of dressers 16. The CMP device includes a rotating platform 20. A polish pad 22 is disposed on the rotating platform 20. Furthermore, the polishing pad 22 comprises a layer of microporous polyurethane material having an upward working surface 24. A wafer carrier 26 is used to carry a wafer 28 to be polished by the working surface 24 of the polishing pad 22 and a polishing slurry 30. The polishing slurry 30 is delivered onto the working surface 24 via a nozzle 32, whereby the porous polishing pad 22 is permeated with the polishing slurry 30.

FIG. 2 is a cross-section of the dresser 16. The dresser 16 includes a substrate 50, a plurality of diamonds 52, and a bonding layer 54, wherein the bonding layer 54 is used for mounting the diamonds 52 onto the substrate 50. In practice, however, some of the diamonds 52 fall off and attach to the working surface 24 of the polishing pad 22 in cleaning, thus causing wafers be damaged in subsequent polishing processes.

SUMMARY OF THE INVENTION

The object of the present invention is to solve the above-mentioned problems and to provide a CMP machine dresser and method for detecting dislodgement of diamonds from the same. Immediate detection can prevent wafer damage for the subsequent polishing process.

The present invention discloses-a CMP machine dresser, comprising a substrate, a first conductive layer and a second conductive layer respectively disposed and isolated in the substrate, a plurality of diamonds mounted in the first conductive layer and the second conductive layer, and a bonding layer disposed on the substrate for attaching the diamonds. The first conductive layer and the second conductive layer detect the conductive materials penetrating into the original position of the diamonds when any of the diamonds dislodges.

Furthermore, the invention proposes a method for detecting diamonds dislodging from the CMP machine dresser comprising the steps of providing a substrate, in which a first conductive layer and a second conductive layer are respectively disposed and isolated, and mounting a plurality of diamonds in the first conductive layer and the second conductive layer, and disposing a bonding layer for attaching the diamonds to the substrate; and detecting whether or not the short circuit of the first conductive layer to the second conductive layer occurs, so as to determine whether any of the diamonds dislodges; wherein, the short circuit of the first conductive layer to the second conductive layer occurs when any of the diamonds dislodges and conductive materials penetrate the original position of the diamonds.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENT

Figure 1:
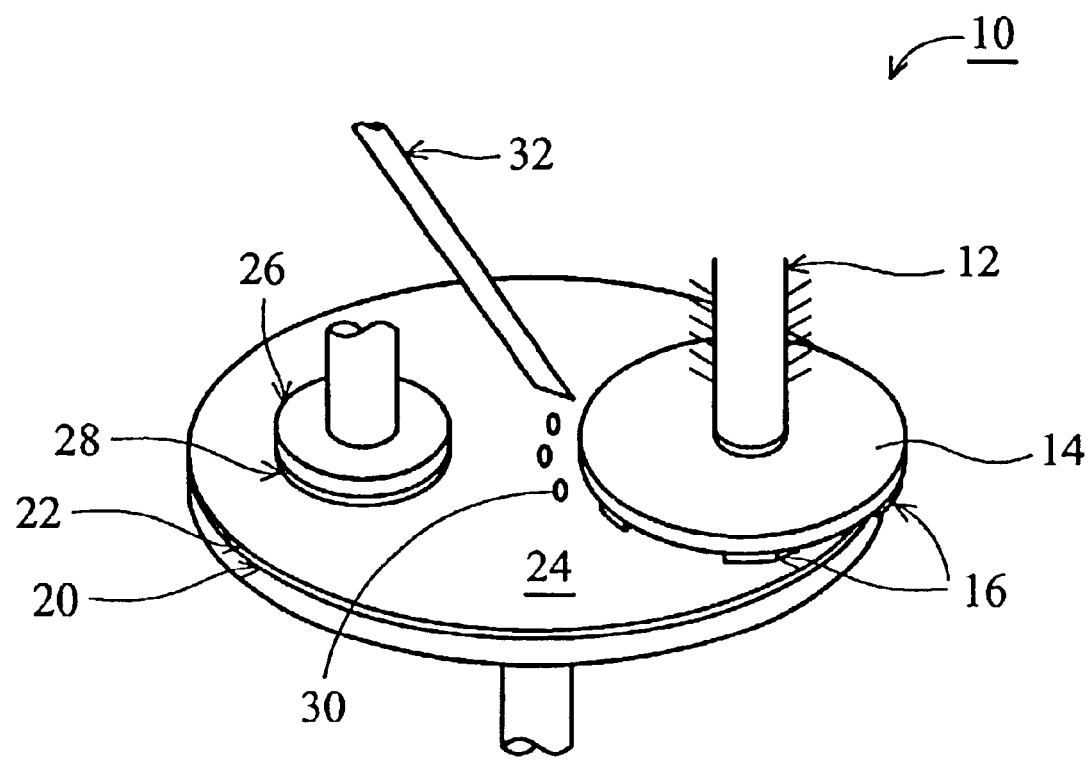
FIG. 1 shows a perspective view of a dressing apparatus.
Figure 2:
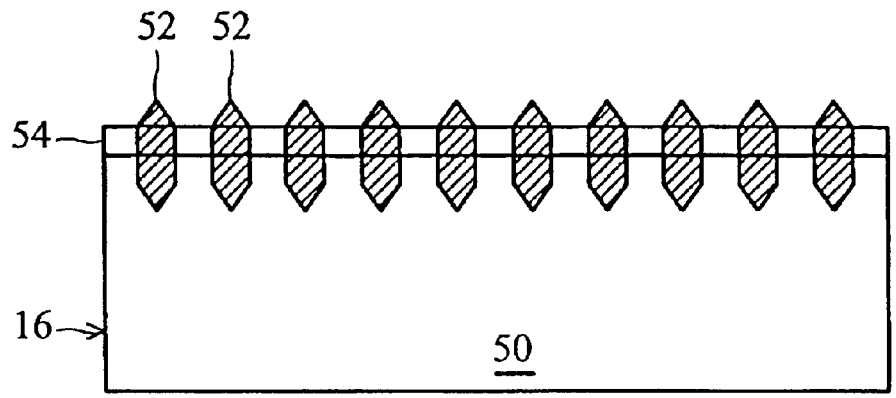
FIG. 2 (Prior Art) is a cross-section of a conventional dresser.
Figure 3:
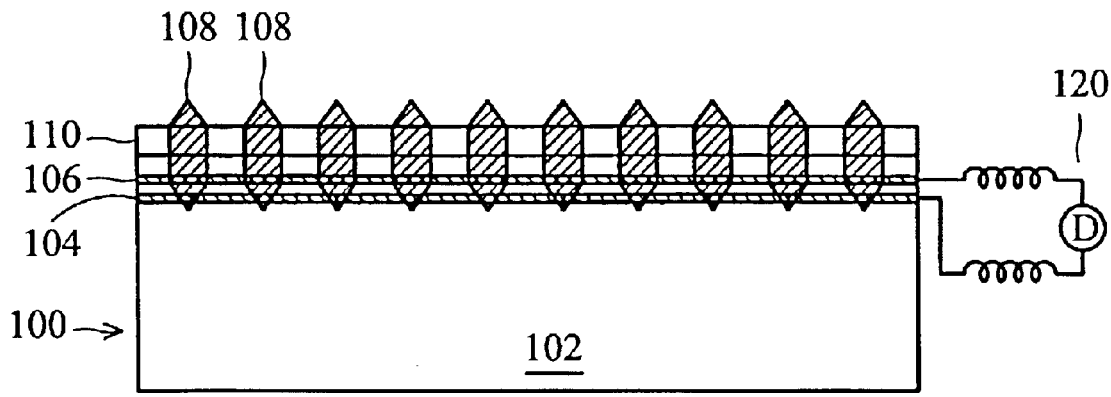
FIG. 3 is a cross-section of the dresser in the preferred embodiment.

FIG. 3 is a cross-section of the dresser in the preferred embodiment. As shown in FIG. 3, the dresser 100 includes a substrate 102, a first conductive layer 104 and a second conductive layer 106 respectively disposed and isolated in the substrate. The first conductive layer 104 and the second conductive layer 106 can be comprised of, for example, any conductive material, such as metals or alloys.

A plurality of diamonds 108 are mounted in the first conductive layer 104 and the second conductive layer 106. A bonding layer 110 is disposed on the substrate 102 for attaching the diamonds 108.

The dresser 100 in the preferred embodiment can further use a detecting circuit 120, connected to the first conductive layer 104 and the second conductive layer 106. The detecting circuit 120 can feed back to the chemical mechanical polishing machine when the short circuit of the first conductive layer 104 to the second conductive layer 106 occurs. The detecting circuit 120 can be comprised of, for example, a low voltage and current circuit.

Figure 4:
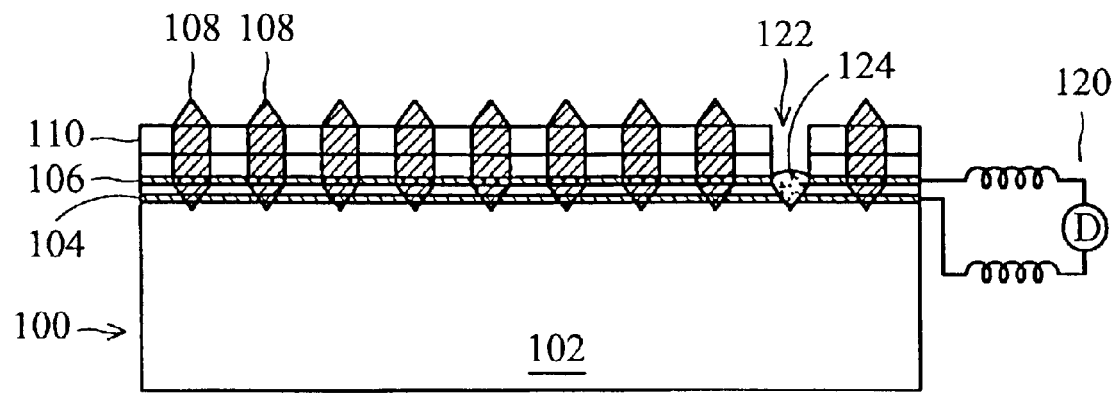
FIG. 4 is a schematic drawing illustrating when some of the diamonds of the dresser fall off and the short circuit occurs in the preferred embodiment.

FIG. 4 is a schematic drawing illustrating a number of diamonds dislodging from the dresser and the subsequent short circuit. A void 122 is formed when one of the diamonds 108 dislodges. If conductive materials 124 penetrate the void 122, the short circuit of the first conductive layer 104 to the second conductive layer 106 occurs, so as to detect any of the diamonds dislodging. Meanwhile, the detecting circuit 120 feeds back to the chemical mechanical polishing machine and ceases operation. The conductive materials 124 can be comprised of, for example, a polishing slurry or water.

A method for detecting diamonds dislodging from the CMP machine dresser according to the preferred embodiment of the present invention will now be described. First, a substrate is provided in which a first conductive layer and a second conductive layer are respectively disposed and isolated, and a plurality of diamonds are mounted in the first conductive layer and the second conductive layer, and a bonding layer is disposed for attaching the diamonds to the substrate. Detection for short circuits between the first conductive layer and the second conductive layer is carried out, so as to determine whether any of the diamonds dislodges. Thus, when diamonds dislodge and conductive materials penetrate the original position of the diamonds, a short circuit between the first conductive layer and the second conductive layer occurs. The first conductive layer and the second conductive layer can be comprised of, for example, any conductive materials, such as metals or alloys. The conductive materials can be comprised of, for example, a polishing slurry or water.

The method for detecting diamonds dislodging from the CMP machine dresser according to the preferred embodiment of the present invention further comprises a step of using a detecting circuit connected to the first conductive layer and the second conductive layer, then feeding back to the chemical mechanical polishing machine when the short circuit of the first conductive layer to the second conductive layer occurs.

Any of the diamonds dislodging is detected immediately, thereby preventing wafers from damage in the subsequent polishing process.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modifications or embodiments as may fall within the scope of the invention defined by the following claims and their equivalents.

What is claimed is:

1. A dresser for dressing a polishing pad of a polishing machine, comprising:
   a substrate mounted to a dressing apparatus;
   a first conductive layer and a second conductive layer respectively disposed in the substrate, wherein the first and second conductive layers are isolated from each other;
   a plurality of diamonds mounted at locations in the substrate, wherein each diamond contacts both the first conductive layer and the second conductive layer; and
   a bonding layer disposed on the substrate for attaching the diamonds;
   wherein when any of the diamonds is dislodged from its location in the substrate, a short circuit is formed by electrically connecting the first conductive layer to the second conductive layer via conductive materials collecting in the location of the dislodged diamond.

2. The dresser as recited in claim 1, further comprising a detecting circuit, connected to the first conductive layer and the second conductive layer, and feeding back to the polishing machine when the short circuit occurs.

3. The dresser as recited in claim 1, wherein the first and second conductive layers comprise metals or alloys.

4. The dresser as recited in claim 2, wherein the detecting circuit comprises a low voltage and current circuit.

5. A method for detecting diamonds dislodging from a dresser placed in a polishing environment,
   providing a substrate mounted to a dressing apparatus;
   respectively forming a first conductive layer and a second conductive layer in the substrate, wherein the first and second conductive layers are isolated from each other;
   mounting a plurality of diamonds in the substrate, wherein each diamond contacts both the first conductive layer and the second conductive layer;
   forming a bonding layer on the substrate to attach the diamonds; and
   forming at least one void exposing the first and second conductive layers when any of the diamonds is dislodged from the substrate;
   wherein when conductive material provided from the polishing environment is introduced into the void, the first and second conductive layers constitute a short circuit such that diamonds dislodgement is detected.

6. The method as recited in claim 5, further comprising a step of using a detecting circuit connected to the first conductive layer and the second conductive layer, then feeding back to a polishing machine when the short circuit occurs.

7. The dresser as recited in claim 5, wherein the first and second conductive layers comprise metals or alloys.

8. The method as recited in claim 5, wherein the conductive material comprises a polishing slurry.

9. The method as recited in claim 5, wherein the conductive material comprises water.

10. The method as recited in claim 6, wherein the detecting circuit comprises a low voltage and current circuit.

11. An apparatus, comprising:
    a first conductive layer and a second conductive layer respectively disposed and isolated in a substrate; and
    a plurality of non-conductive grinding elements mounted in the substrate to contact both the first and second conductive layers;
    wherein when any of the non-conductive grinding elements is dislodged from the substrate, a short circuit is formed by electrically connecting the first conductive layer to the second conductive layer when conductive material enters a cavity in the substrate associated with the dislodged grinding element.

12. The apparatus as recited in claim 11, further comprising a detecting circuit, connected to the first conductive layer and the second conductive layer, and feeding back to a polishing machine when the short circuit occurs.

13. The apparatus as recited in claim 11, wherein the first and second conductive layers comprise metals or alloys.

14. The apparatus as recited in claim 12, wherein the detecting circuit comprises a low voltage and current circuit.

15. The apparatus as recited in claim 11, wherein the non-conductive grinding elements are diamonds.

* * * * *